(12) United States Patent
Athmanathan et al.

(10) Patent No.: US 9,548,110 B2
(45) Date of Patent: Jan. 17, 2017

(54) MEMORY DEVICE AND METHOD FOR THERMOELECTRIC HEAT CONFINEMENT

(71) Applicant: International Business Machines Corporation, Armonk, NY (US)

(72) Inventors: Aravinthan Athmanathan, Adliswil (CH); Daniel Krebs, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/819,475

(22) Filed: Aug. 6, 2015

(65) Prior Publication Data

US 2016/0104529 A1    Apr. 14, 2016

(30) Foreign Application Priority Data

Aug. 14, 2014  (GB) .................................. 1414427.3

(51) Int. Cl.
*G11C 11/00* (2006.01)
*G11C 13/00* (2006.01)
*H01L 45/00* (2006.01)

(52) U.S. Cl.
CPC ......... *G11C 13/0004* (2013.01); *G11C 13/004* (2013.01); *G11C 13/0069* (2013.01); *H01L 45/06* (2013.01); *H01L 45/126* (2013.01); *H01L 45/1233* (2013.01); *H01L 45/1286* (2013.01); *H01L 45/1293* (2013.01);
(Continued)

(58) Field of Classification Search
None
See application file for complete search history.

(56) References Cited

U.S. PATENT DOCUMENTS 6,791,102 B2  9/2004  Johnson et al.
7,426,134 B2  9/2008  Happ et al.
(Continued)

FOREIGN PATENT DOCUMENTS

WO         2008127866 A1    10/2008
WO   WO 2008/127866 A1    10/2008
(Continued)

OTHER PUBLICATIONS eFunda, http://www.efunda.com/home.cfm, retrieved from the internet Oct. 15, 2015, 2 pages.
(Continued)

*Primary Examiner* — Son Dinh
*Assistant Examiner* — Sultana Begum
(74) *Attorney, Agent, or Firm* — Francis Lammes; Stephen J. Walder, Jr.; Kurt P. Goudy

(57) ABSTRACT

A memory device for thermoelectric heat confinement and method for producing same. The memory device includes a plurality of phase-change memory cells, wherein each of the phase-change memory cells has a first electrode, a second electrode and a phase-change material. The first electrode and the phase-change material are arranged such that a surface normal of a dominating interface for a current flow between the first electrode and the phase-change material points on one side to the phase-change material of the phase-change memory cell and on an opposite side to a phase-change material of a neighboring phase-change memory cell. A method for producing a memory device for thermoelectric heat confinement is also provided.

20 Claims, 11 Drawing Sheets

(52) U.S. Cl.
CPC ........ *H01L 45/14* (2013.01); *G11C 2013/008* (2013.01); *G11C 2213/50* (2013.01)

(56) References Cited

U.S. PATENT DOCUMENTS

| | | |
|---|---|---|
| 7,508,110 B2 | 3/2009 | Chen et al. |
| 7,542,338 B2 | 6/2009 | Scheuerlein et al. |
| 7,714,315 B2 | 5/2010 | Happ et al. |
| 8,076,569 B2 | 12/2011 | Greiff et al. |
| 8,378,328 B2 | 2/2013 | Breitwisch et al. |
| 8,379,438 B2 | 2/2013 | Tio Castro et al. |
| 8,486,745 B2 | 7/2013 | Kordus, II et al. |
| 8,558,213 B2 | 10/2013 | Goux |
| 8,624,236 B2 | 1/2014 | Lung et al. |
| 8,929,698 B2 | 1/2015 | Peng et al. |
| 2004/0131102 A1 | 7/2004 | Jette et al. |
| 2005/0247337 A1 | 11/2005 | Chen et al. |
| 2006/0266993 A1 | 11/2006 | Suh et al. |
| 2007/0099377 A1* | 5/2007 | Happ ............... H01L 27/2436 438/257 |
| 2008/0023685 A1 | 1/2008 | Czubatyj et al. |
| 2008/0029158 A1 | 2/2008 | Park et al. |
| 2008/0271778 A1 | 11/2008 | Defries et al. |
| 2010/0021104 A1 | 1/2010 | Yamagiwa et al. |
| 2010/0031990 A1 | 2/2010 | Francoeur et al. |
| 2010/0048020 A1 | 2/2010 | Schrott et al. |
| 2010/0084741 A1 | 4/2010 | Andres et al. |
| 2010/0270527 A1 | 10/2010 | Sawamura |
| 2010/0288352 A1 | 11/2010 | Ji et al. |
| 2010/0288993 A1 | 11/2010 | Rho |
| 2011/0204231 A1 | 8/2011 | Razansky et al. |
| 2011/0266516 A1 | 11/2011 | Park |
| 2012/0207654 A1 | 8/2012 | Lee et al. |
| 2012/0305875 A1* | 12/2012 | Shim ................. H01L 45/06 257/2 |
| 2013/0033972 A1 | 2/2013 | Hara et al. |
| 2013/0061605 A1 | 3/2013 | de Rochemont |
| 2013/0258767 A1 | 10/2013 | Krebs et al. |
| 2014/0151678 A1 | 6/2014 | Sakuma et al. |
| 2014/0151729 A1 | 6/2014 | Orsley et al. |
| 2014/0218867 A1 | 8/2014 | Kim et al. |
| 2014/0252305 A1 | 9/2014 | Tanielian |
| 2014/0345663 A1* | 11/2014 | Hayakawa ............ H01L 35/14 136/205 |
| 2015/0011029 A1 | 1/2015 | Mangum et al. |
| 2015/0236222 A1 | 8/2015 | Kurtin et al. |

FOREIGN PATENT DOCUMENTS

| | | |
|---|---|---|
| WO | 2010038216 A1 | 4/2010 |
| WO | WO 2010/038216 A1 | 4/2010 |
| WO | WO 2010/107720 A2 | 9/2010 |
| WO | 2011060032 A1 | 5/2011 |
| WO | WO 2011/060032 A1 | 5/2011 |
| WO | WO 2013/062220 A1 | 5/2013 |
| WO | WO 2013/159075 A1 | 10/2013 |

OTHER PUBLICATIONS

Battaglia, Jean-Luc et al., "Thermal characterization of the SiO2—Ge2Sb2Te5 interface from room temperature up to 400 C", HAL, http://hal.archives-ouvertes.fr/docs/00/74/01/47/PDF/16265282.pdf, British Journal of Applied Physics, Institute of Physics, vol. 107, No. 4, Oct. 16, 2012, 7 pages.

Chao, Der-Sheng et al., "Enhanced Thermal Efficiency in Phase-Change Memory Cell by Double GST Thermally Confined Structure", IEEE, IEEE Electron Device Letters, vol. 28, No. 10, Oct. 2007, pp. 871-873.

Reifenberg, John P. et al., "The Impact of Thermal Boundary Resistance in Phase-Change Memory Devices", IEEE, IEEE Electron Device Letters, vol. 29, No. 10, Oct. 2008, pp. 1112-1114.

Wong, H.-S. P. et al., "Metal-Oxide RRAM", IEEE, Invited Paper, Proceedings of the IEEE, vol. 100, No. 6, Jun. 2012, pp. 1951-1970.

Wong, H.-S. P., "Phase Change Memory", IEEE, Invited Paper, Proceedings of the IEEE, vol. 98, No. 12, Dec. 2010, pp. 2201-2227.

Chao, Der-Sheng et al., Enhanced Thermal Efficiency in Phase-Change Memory Cell by Double GST Thermally Confined Structure, IEEE Electron Device Letters, Oct. 2007, 871-873, vol. 28, No. 10, IEEE. http://ieeexplore.ieee.org/stamp/stamp.jsp?arnumber=4317652.

Goodson, Kenneth E. et al., The Impact of Thermal Boundary Resistance in Phase-Change Memory Devices, IEEE Electron Device Letters, Oct. 2008, 1112-1114, vol. 29, No. 10, IEEE. http://ieeexplore.ieee.org/stamp/stamp.jsp?arnumber=4623116.

H.-S. P. Wong et al., Phase-Change Memory, Proceedings of the IEEE, 2010, 2201-2227, vol. 98, No. 12, IEEE. http://ieeexplore.ieee.org/stamp/stamp.jsp?tp=&arnumber=5609179.

H.-S. P. Wong et al., Metal-oxide RRAM, Proceedings of the IEEE, 2012, 1951-1970, vol. 100, No. 6, IEEE. http://ieeexplore.ieee.org/stamp/stamp.jsp?tp=&arnumber=6193402.

GB Application No. 1315193.1, filed on Aug. 27, 2013, entitled: "Nanodevice Assemblies", 16 pages.

Great Britain Search Report, Application No. GB1315193.1, Date of Search: Jan. 10, 2014, 4 pages.

Basu, Soumyadipta et al., "Near-field radiative transfer based thermal rectification using doped silicon", Applied Physics Letters, vol. 98, Mar. 15, 2011, pp. 113106-1-113106-3.

Basu, S. et al., "Review of near-field thermal radiation and its application to energy conversion", International Journal of Energy Research, vol. 33, Sep. 2, 2009, pp. 1203-1232.

Cerdonio, M. et al., "Thermoelastic effects at low temperatures and quantum limits in displacement measurements", Physical Review D, vol. 63, Mar. 23, 2001, pp. 082003-1-082003-9.

Chapius, Pierre-Olivier et al., "Heat transfer between a nano-tip and a surface", Nanotechnology, vol. 17, No. 12, Feb. 14, 2008, 7 pages.

Cook, R. F., "Electron energy loss spectra of GeTe—SnTe alloys", Philosophical Magazine, 24:192, Jul. 23, 1971, pp. 1347-1353.

Hopkins, Patrick E. et al., "Controlling thermal conductance through quantum dot roughening at interfaces", Physical Review B, vol. 84, Jul. 27, 2011, pp. 035438-1-035438-7.

Loomis, Jackson J. et al., "Theory of heat transfer by evanescent electromagnetic waves", Physical Review B, vol. 50, No. 24, Dec. 15, 1994, pp. 18 517-18 524.

Luther, Joseph M. et al., "Localized surface plasmon resonances arising from free carriers in doped quantum dots", Nature Materials, vol. 10, May 2011, pp. 361-366.

Narayanaswamy, Arvind et al., "Thermal near-field radiative transfer between two spheres", Physical Review B 77, Feb. 25, 2008, pp. 075125-1-075125-12.

Pendry, JB, "Radiative Exchange of Heat Between Nanostructures", Journal of Physics: Condensed Matter, vol. 11, Apr. 25, 1999, 16 pages.

Shen, Sheng et al., "Surface Phonon Polaritons Mediated Energy Transfer between Nanoscale Gaps", Nano Letters, vol. 9, No. 8, Published on Web Jul. 2, 2009, pp. 2909-2913.

Shi, Jiawei et al., "Tuning near field radiation by doped silicon", Applied Physics Letters, vol. 102, May 9, 2013, pp. 183114-1-183114-4.

Solis, Jr., David et al., "Electromagnetic Energy Transport in Nanoparticle Chains via Dark Plasmon Modes", Nano Letters, vol. 12, Jan. 31, 2012, pp. 1349-1353.

Sosso, Gabriele C. et al., "Thermal transport in phase-change materials from atomistic simulations", Physical Review B 86, Sep. 7, 2012, pp. 104301-1-104301-5.

Giuliani, Gabriele F. et al., "Charge-Density Excitations at the Surface of a Semiconductor Superlattice: A New Type of Surface Polariton", Physical Review Letters, vol. 51, No. 10, Sep. 5, 1983, pp. 919-922.

Ivanda, M. et al., "Raman light-to-vibration coupling coefficient of v-SiO2 in spectral interval range up to 600 cm-1", Solid State Communications, vol. 117, Issue 7, Jan. 9, 2001, pp. 423-428.

Kuo, David M. et al., "Thermoelectric and Thermal rectification properties of quantum dot junctions", Physical Review B, vol. 81, No. 205321, May 26, 2010, pp. 205321-1 thru 205321-10.

(56) References Cited

OTHER PUBLICATIONS

Ocelic, N. et al., "Subwavelength-scale tailoring of surface phonon polaritons by focused ion-beam implantation", Nature Materials, vol. 3, Sep. 2004, pp. 606-609.

* cited by examiner

MEMORY DEVICE AND METHOD FOR THERMOELECTRIC HEAT CONFINEMENT

CROSS-REFERENCE TO RELATED APPLICATION

This application claims the benefit of priority from United Kingdom Patent Application No. 1414427.3, filed Aug. 14, 2014, the contents of which are incorporated herein by reference.

FIELD OF THE INVENTION

The invention relates to a memory device for thermoelectric heat confinement having a plurality of programmable phase-change memory cells. Moreover, the invention relates to a method for producing such a memory device for thermoelectric heat confinement.

BACKGROUND

A prominent example for programmable phase-change memory cells having a plurality of programmable levels or states is Resistive Random Access Memory ("RRAM"), particularly phase change memory ("PCM"). PCM is a non-volatile solid-state memory technology that exploits the reversible, thermally-assisted switching of specific chalcogenides between certain states of different electrical conductivity.

PCM is a promising and advanced emerging non-volatile memory technology mainly due to its excellent features including low latency, high endurance, long retention and high scalability. PCM can be considered a candidate for Flash replacement, embedded/hybrid memory and storage-class memory. Key requirements for competitiveness of PCM technology can be multi-level cell functionality, in particular for low cost per bit and high-speed read/write operations, in particular for high bandwidth and high endurance. Multilevel functionality, i.e. multiple bits per PCM cell, can be a way to increase storage capacity and thereby to reduce cost.

Multi-level PCM is based on storing multiple resistance levels between a lowest (SET) and a highest (RESET) resistance value. Multiple resistance levels or levels correspond to partial-amorphous and partial-crystalline phase distributions of the PCM cell. Phase transformation, i.e. memory programming, can be enabled by Joule heating. In this regard, Joule heating can be controlled by a programming current or voltage pulse. Storing multiple resistance levels in a PCM cell is a challenging task.

For example, in "Phase-Change Memory", it is described that the multiple states or levels in a PCM cell are created by varying the programming power, thus creating different crystalline and amorphous fractions within the cell. Further according to "Metal-oxide RRAM", in metal-oxide resistive memory devices, multiple states can correspond to variations in the gap between conductive oxygen-vacancy filaments and the electrodes.

In resistive memory, the fundamental storage unit (referred to generally herein as the "cell") can be set to a number of different states which exhibit different electrical resistance characteristics. Information is recorded by exploiting the different states to represent different data values. To read recorded data, cell-state is detected via measurements which exploit the differing resistance characteristics to differentiate between possible cell-states. A variety of semiconductor memory technologies employ these basic principles for data storage. Examples include oxide-based memory such as resistive RAM and memristor memory, ionic-transport-based memory, and PCM. The following will focus on PCM as a particularly promising technology for future non-volatile memory chips. It is to be understood however, that PCM is only an illustrative application for the invention to be described which can be similarly applied to other resistive memory technologies.

PCM exploits the reversible switching of certain chalcogenide materials between at least two states with different electrical resistance. In single-level cell ("SLC") PCM devices, each cell can be set to one of two states, crystalline and amorphous, by application of heat. Each SLC cell can thus store one bit of binary information. However, to satisfy market demand for ever-larger memory capacity and reduce cost per bit, storage of more than one bit per cell is required. To achieve this, it is necessary that a cell can be set to s states where s>2, and that these states can be distinguished on readback via the cell resistance characteristics. Multi-level cell ("MLC") operation has been proposed for PCM cells whereby each cell can be set to one of s>2 resistance levels, each corresponding to a different cell state. MLC operation is achieved by exploiting partially-amorphous states of the chalcogenide cell. Different cell states are set by varying the effective volume of the amorphous phase within the chalcogenide material. This in turn varies cell resistance.

To write data to a PCM cell, a voltage or current pulse is applied to the cell to heat the chalcogenide material to an appropriate temperature to induce the desired cell-state on cooling. By varying the amplitude of the voltage or current pulses, different cell-states can be achieved. Reading of PCM cells can be performed using the cell resistance to distinguish the different cell-states. The resistance measurement for a read operation is performed in the sub-threshold region of the current-versus-voltage ("IN") characteristic of the cell, i.e. in the region below the threshold switching voltage at which a change in cell-state can occur. The read measurement can be performed in a variety of ways, but all techniques rely fundamentally on either voltage biasing and current sensing, or current biasing and voltage sensing. In a simple implementation of the current-sensing approach, the cell is biased at a certain constant voltage level and the resulting cell current is sensed to provide a current-based metric for cell-state. U.S. Pat. No. 7,426,134 B2 discloses one example of a current-sensing technique in which the bias voltage can be set to successive higher levels. The resulting cell-current compared to successive reference levels, for detecting the different cell-states. U.S. Pat. No. 7,542,338 B2 discloses a similar technique in which the cell current is simultaneously compared with different reference levels. In the alternative, voltage-sensing approach, a constant current is passed through the cell and the voltage developed across the cell is sensed to provide a voltage-based metric for cell-state.

For example, during RESET operation, the phase-change material in a PCM cell is heated above its melting temperature which is typically around 900 K. During SET operation, a temperature of typically about 450 K needs to be reached.

As the technology nodes progress towards 20 nm and beyond, the distance between two neighboring PCM cells becomes very small and very steep temperature gradients need to be reached to write one PCM cell without disturbing the other PCM cell.

A multitude of conventional solutions exist to avoid thermal disturb such as more thermally resistive materials between the neighboring PCM cells or deflection layers for thermal heat. But none of the conventional solutions alone can be sufficient to solve the thermal disturb problem. Additionally, some of the conventional solutions suffer from a trade-off between heat deflection and heat generation. When a deflection heat pathway is provided to lower the temperature at the neighboring PCM cell, the temperature in the written PCM cell is also lower so that the power consumption increases disadvantageously.

US 2013/0258767 A1 describes a PCM cell. A PCM cell includes a phase change material; a reference electrical terminal disposed on first side of the phase change material; first and second electrical terminals disposed on a second side of the phase change material; the phase-change material configured to be reversibly transformable between an amorphous phase and a crystalline phase, in response to a phase-altering electrical signal applied to the phase-change material via the reference electrical terminal and at least one of the first and second electrical terminals; a resistance measurement unit configured to measure a respective electrical resistance between each of the first and second electrical terminals and the reference electrical terminal; and a mathematical operation unit configured to determine a mathematical relation between the respective electrical resistances measured between each of the electrical terminals and the reference electrical terminal.

U.S. Pat. No. 6,791,102 B2 describes a method to manufacture a PCM. The PCM can include a phase change material having a bottom portion, a lateral portion, and a top portion. The PCM can further include a first electrode material contacting the bottom portion and the lateral portion of the phase change material and a second electrode material contacting the top portion of the phase change material.

WO 2010/038216 A1 describes PCM cells and fabrication thereof. A PCM cell includes two electrodes; PCM material and a dielectric barrier. The dielectric barrier is arranged to provide electron tunneling, e.g. Fowler-Nordheim tunneling, to the PCM memory material. A contact made of PCM material can also be provided. The dielectric barrier is substantially uniform e.g. of substantially uniform thickness, e.g. ≥5 nm.

U.S. Pat. No. 8,558,213 B2 describes a vertical PCM cell. A vertical PCM cell has an active region of PCM material defined either by providing a contact extending only over part of the PCM material or an insulating layer exposing only part of the PCM material. There can be more than one active region per cell allowing more than one bit of data to be stored in each cell.

U.S. Pat. No. 8,624,236 B2 describes a PCM cell having vertical channel access transistor. A device includes a substrate having a first region and a second region. The first region includes a first field effect transistor having a horizontal channel region within the substrate, a gate overlying the horizontal channel region, and a first dielectric covering the gate of the first field effect transistor. The second region of the substrate includes a second field effect transistor comprising a first terminal extending through the first dielectric to contact the substrate, a second terminal overlying the first terminal and having a top surface, and a vertical channel region separating the first and second terminals. The second field effect transistor also includes a gate on the first dielectric and adjacent the vertical channel region, the gate having a top surface that is co-planar with the top surface of the second terminal.

U.S. Pat. No. 8,486,745 B2 describes multi-terminal phase change devices. Phase change devices, and particularly multi-terminal phase change devices, include first and second active terminals bridged together by a phase-change material whose conductivity can be modified in accordance with a control signal applied to a control electrode. This structure allows an application in which an electrical connection can be created between the two active terminals, with the control of the connection being effected using a separate terminal or terminals. Accordingly, the resistance of the heater element can be increased independently from the resistance of the path between the two active terminals. This allows the use of smaller heater elements thus requiring less current to create the same amount of Joule heating per unit area. The resistance of the heating element does not impact the total resistance of the phase change device. The programming control can be placed outside of the main signal path through the phase change device, reducing the impact of the associated capacitance and resistance of the device.

In "Enhanced Thermal Efficiency in Phase Change Memory Cell by Double GST Thermally Confined Structure", an enhanced thermal efficiency in PCM cell by double GST thermally confined structure is described.

Accordingly, it is an aspect of the present invention to provide an improved memory device including a plurality of PCM cells.

SUMMARY OF THE INVENTION

In one aspect, a memory device for thermoelectric heat confinement is provided. The memory device includes a plurality of PCM cells, wherein each of the PCM cells has a first electrode, a second electrode and a phase-change material. The first electrode and the phase-change material are arranged such that a surface normal of an interface for a current flow between the first electrode and the phase-change material points on one side to the phase-change material of the PCM cell and on an opposite side to a phase-change material of a neighboring PCM cell.

In another aspect, a method for producing a memory device for thermoelectric heat confinement is provided. The method includes the following steps: providing a plurality of PCM cells, each having a first electrode, a second electrode and a phase-change material. The first electrode and the phase-change material are arranged such that a surface normal of an interface for a current flow between the first electrode and the phase-change material points on one side to the phase-change material of the PCM cell and on an opposite side to a phase-change material of a neighboring PCM cell.

In the following, exemplary embodiments of the present invention are described with reference to the enclosed figures.

BRIEF DESCRIPTION OF THE DRAWINGS

Similar or functionally similar elements in the figures have been allocated the same reference signs if not otherwise indicated.

DETAILED DESCRIPTION OF THE PREFERRED EMBODIMENTS

Figure 1:
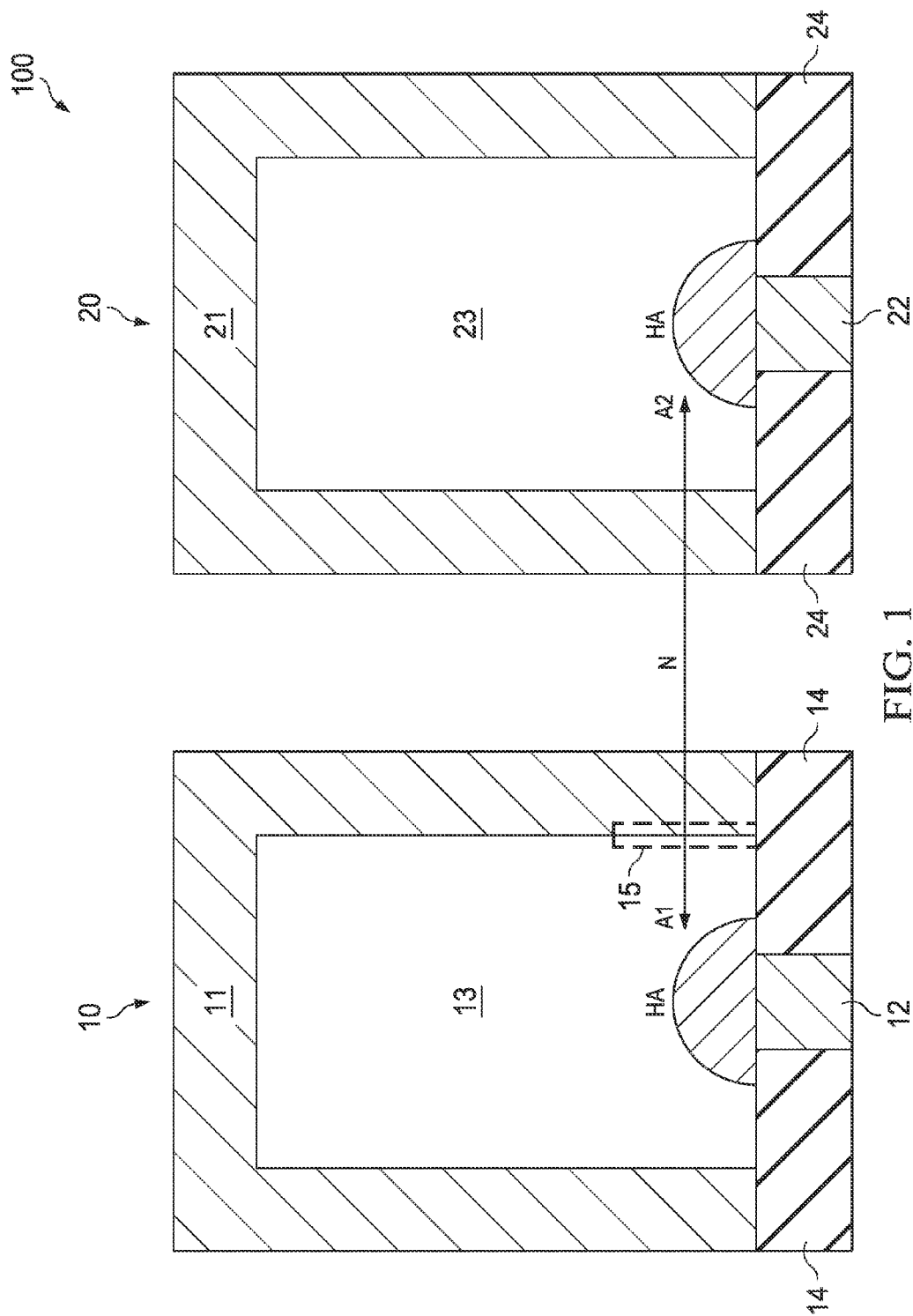
FIG. 1 shows a first embodiment of a memory device for thermoelectric heat confinement.

FIG. 1 shows a first embodiment of a memory device 100 for thermoelectric heat confinement. The memory device 100 includes a plurality s of PCM cells 10, 20 (s≥2). Without loss of generality, s=2 in FIG. 1.

Each of the PCM cells 10, 20 has a first electrode 11, 21, a second electrode 12, 22 and a phase-change material 13, 23 (or phase-change layer).

For example, the PCM cell 10 has the first electrode 11, the second electrode 12 and the phase-change material 13. The phase-change material 13 is arranged between the first electrode 11 and the second electrode 12.

In the following, the thermoelectric heat confinement for the PCM cell 10 is described. The PCM cell 20 has an identical structure as the PCM cell 10. Thus, the same description can be also applied to memory cell 20.

In the PCM cell 10, the first electrode 11 and the phase-change material 13 are arranged such that the surface normal N of a dominating interface 15 for a current flow between the first electrode 11 and the phase-change material 13 points on one side (identified by arrow A1) to the phase-change material 13 of the PCM cell 10 and on an opposite side (identified by arrow A2) to the phase-change material 23 of the neighboring PCM cell 20. To meet this arrangement, the first electrode 11 of FIG. 1 has a cup shape. The first electrode 11 can also have a pen shape or a pot shape. The dominating interface 15 is configured for heating the PCM cell 10 being programmed while cooling the neighboring PCM cell 20. In FIG. 1, the reference sign HA indicates the heating area or hotspot while the memory cell 10, 20 is programmed.

As shown in FIG. 1, the first electrode 11, 21 of each of the memory cells 10, 20 can be a top electrode, wherein the second electrode 12, 22 of each of the PCM cells 10, 20 can be a bottom electrode. The phase-change material 13, 23 of each of the PCM cells 10, 20 is arranged between the first electrode 11, 21 and the second electrode 12, 22, respectively.

Figure 2:
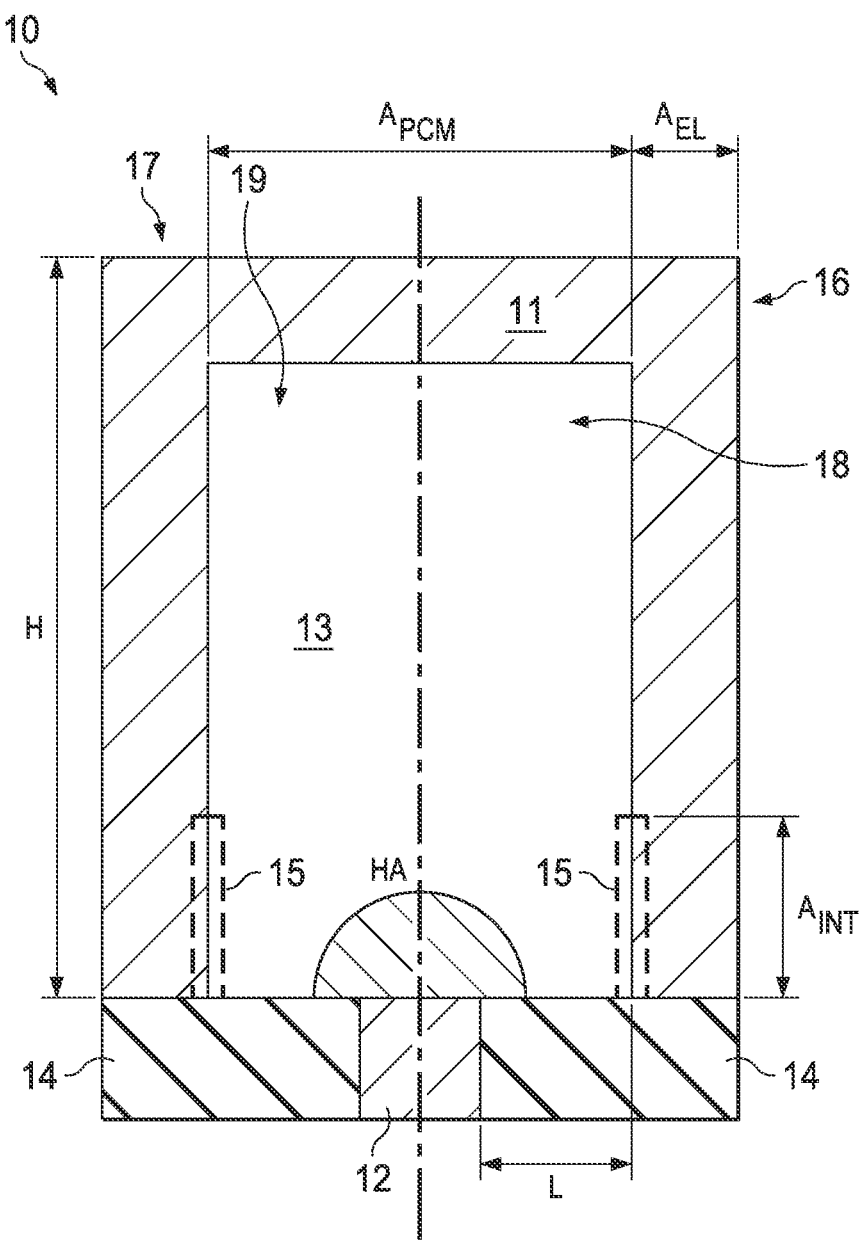
FIG. 2 shows an embodiment of a PCM cell of the memory device of FIG. 1.

In FIG. 2, the embodiment of the PCM cell 10 of FIG. 1 is shown in more detail. FIG. 2 shows that the PCM cell 10 has a first electrode 11, a second electrode 12 and a phase-change material 13 arranged between the first and second electrodes 11, 12.

As indicated above, the first electrode 11 is a cup-shaped top electrode 11. The cup-shaped top electrode 11 has a top region 16 and a side region 17. The top region 16 of the cup-shaped electrode 11 interfaces a top region 18 of the phase-change material 13. Moreover, the side region 17 of the cup-shaped electrode 11 interfaces a side region 19 of the phase-change material 13. The dominating interface 15 for the current flow between the first electrode 11 and the phase-change material 13 is a lateral interface for the current flow. As a result, the lateral interface 15 is configured to heat the PCM cell 10 at the heating area HA very precisely during the memory cell 10 is programmed, while cooling the neighboring PCM cell 20 (see FIG. 1).

In FIG. 2, the following parameters describe the cell design of the PCM cell 10: $A_{EL}$ designates a cross-section of the side region of the cup-shaped top electrode 11 for a vertical current flow through the side region 17. $A_{PCM}$ designates a cross-section of the phase-change material 13 for vertical current flow between the cup-shaped top electrode 11 and the phase-change material 13. ρpcm designates an electrical resistivity of the phase-change material 13. $A_{INT}$ designates a cross-section of the interface 15 for a lateral current flow between the side region 17 of the cup-shaped top electrode 11 and the phase-change material 13. H designates a height of the phase-change material 13. L designates a distance between the cup-shaped top electrode and the bottom electrode. ρel designates an electrical resistivity of the cup-shaped top electrode.

Figure 3:
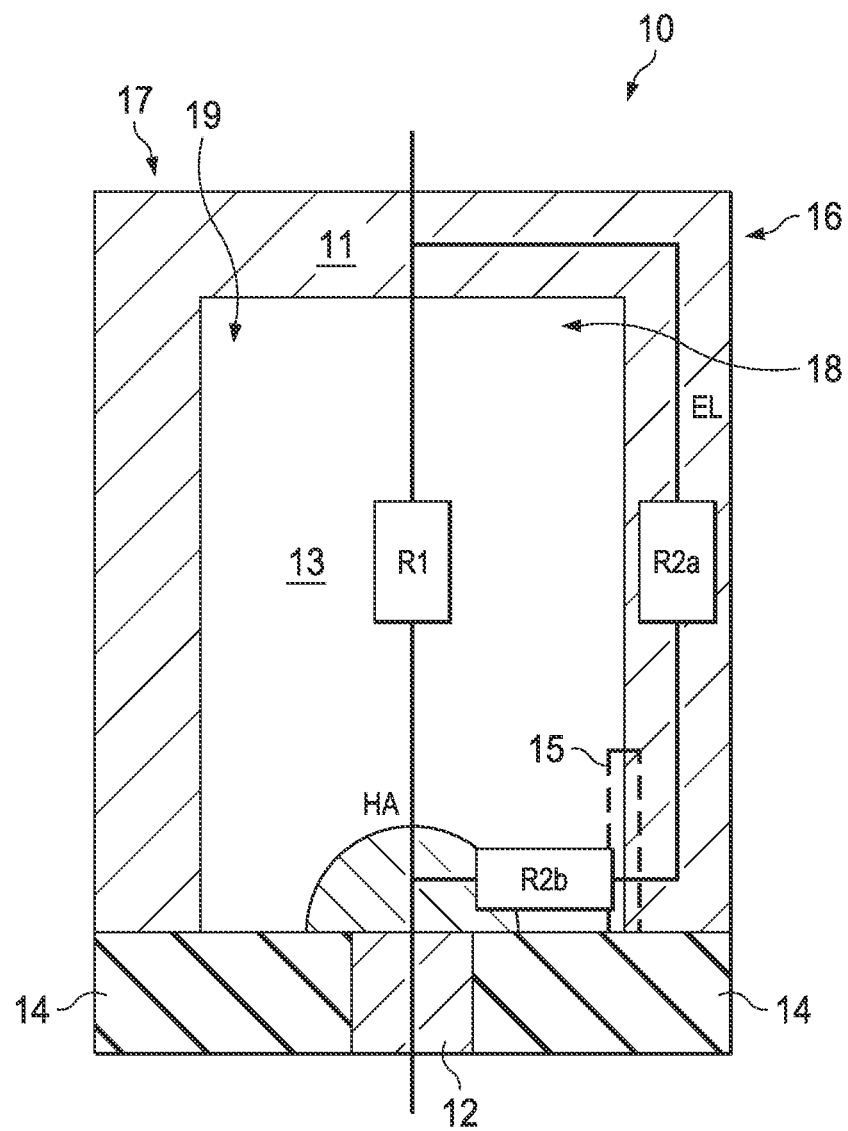
FIG. 3 shows an equivalent circuit of the PCM cell of FIG. 2.

Further, FIG. 3 shows an equivalent circuit EL of the PCM cell 10 of FIG. 2.

The equivalent circuit EL of FIG. 2 is based on the following formulas:

$$R2=R2a+R2b;\ R1=\rho pcm\ H/A_{PCM};\ R2a=\rho el\ H/A_{EL};\ \text{and}\ R2b=\rho pcm\ L/A_{INT}.$$

In the cup-shaped cell design of FIG. 2, the relevant interface 15 between the first electrode 11 and the phase-change material 13 of which the surface normal N points into the favorite directions A1, A2 (see FIG. 1) can be made dominant (i.e. more or higher current flow through interface 15 than through the path of R1) by designing the resistances R1 and R2 such that R1>R2.

To maximize or increase the heating and cooling effects, one can maximize or increase R1/R2a and/or R1/R2b. Maximizing or increasing R1/R2a means maximizing (ρ_pcm·A_el)/(ρ_el·A_pcm). Further, maximizing or increasing R1/R2b means to maximize or increase (H·A_int)/(L·A_pcm).

Figure 4:
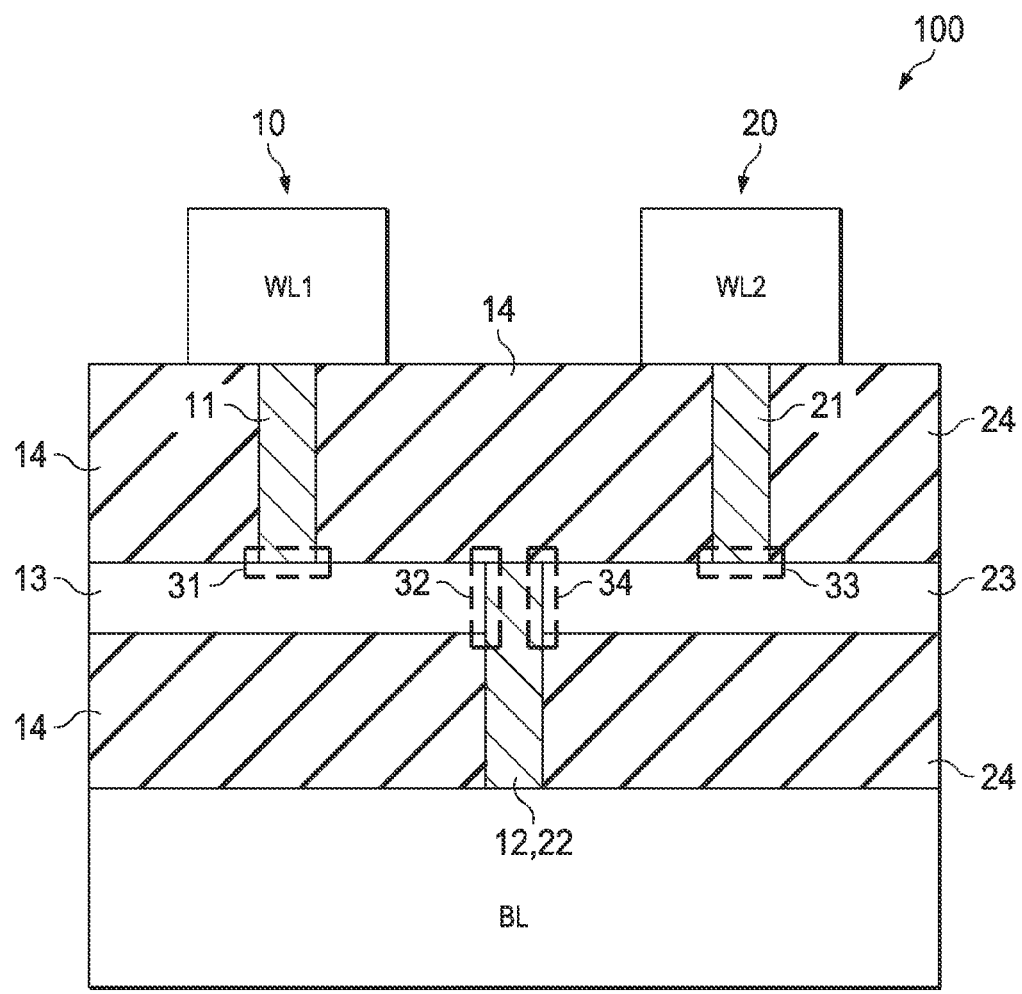
FIG. 4 shows a second embodiment of a memory device for thermoelectric heat confinement.

FIG. 4 shows a second embodiment of a memory device 100 for thermoelectric heat confinement. The memory device 100 of FIG. 4 is based on a sidewall-electrode cell design.

The memory device 100 of FIG. 4 shows two PCM cells 10, 20, wherein both share one common bit line BL. The PCM cell 10 of FIG. 4 has a first electrode 11, a second electrode 12 and a phase-change material 13. The first electrode 11 is a sidewall-electrode connected to a word line WL1 for the PCM cell 10. The second electrode 12 is a heater electrode connected to the common bit line BL. The phase change material 13 is arranged between the sidewall-electrode 11 and the heater electrode 12.

The PCM memory cell 20 shown in the right of FIG. 4 has a first electrode 21 embodied as a sidewall-electrode, a second electrode 22 and a phase-change material 23. As it can be seen in FIG. 4, the second electrode 22 of the PCM cell 20 corresponds to the second electrode 12 of the PCM cell 10. That means that the PCM cells 10, 20 also share the second electrodes 12, 22 as a heater electrode. Moreover, in FIG. 4, reference signs 14, 24 show insulators.

Figure 5:
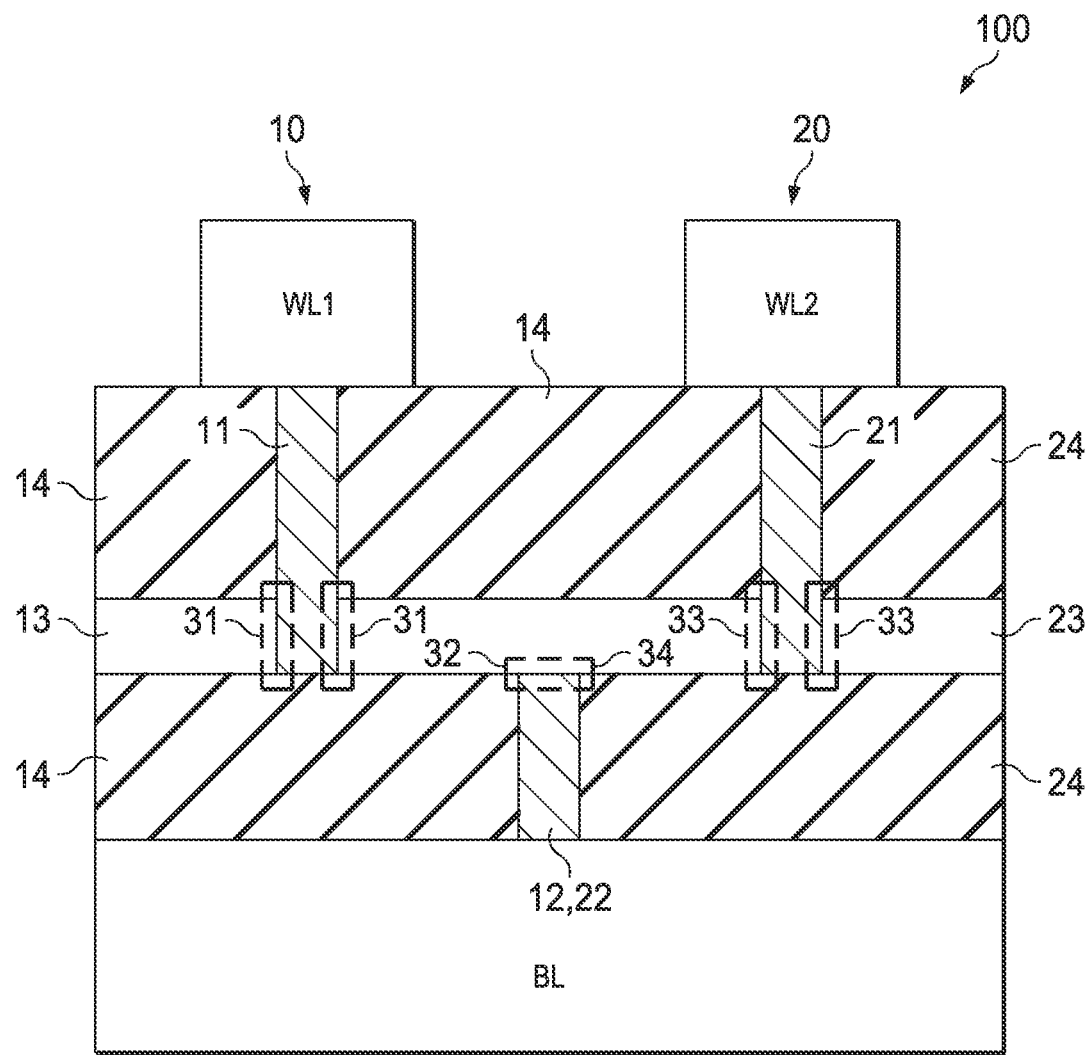
FIG. 5 shows a third embodiment of a memory device for thermoelectric heat confinement.

Each of the PCM cells 10, 20 of FIG. 4 has a first interface 31, 33 for a current flow between its sidewall-electrodes 11, 21 in its phase-change material 13, 23. Further, each of the PCM cells 10, 20 of FIG. 4 has a second interface 32, 34 for a current flow between its heater electrode 12, 22 and its phase-change material 13, 23. In the example of FIG. 4, the first interface 31, 33 is a vertical interface, wherein the second interface 32, 34 is a lateral interface. The embodiment of FIG. 5 differs from that of FIG. 4 therein that in FIG. 5 the first interface 31, 33 is the lateral interface and the second interface 32, 34 is the vertical interface. Recapitulating both embodiments of FIGS. 4 and 5, one of the first and second interfaces 31, 33; 32, 34 is a lateral interface and the other one of the first and second interfaces 31, 33; 32, 34 is a vertical interface.

Figure 6:
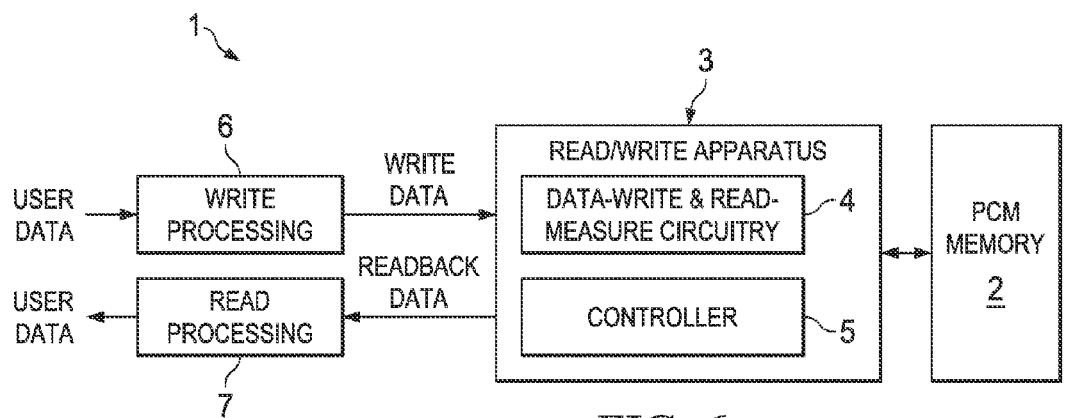
FIG. 6 shows an embodiment of a memory system.

FIG. 6 is a simplified schematic of a memory system 1. The memory system 1 includes a PCM 2 for storing data in at least one memory devices 100 (see FIG. 1). The memory devices 100 of the memory 2 can be provided as integrated arrays of multilevel PCM cells. Though shown as a single block in FIG. 6, in general the PCM 2 can include any desired configuration of memory devices 100 e.g. of FIG. 1, for example, from a single chip or die to a plurality of storage banks each containing multiple packages of storage chips. Reading and writing of data to memory 2 is performed by read/write apparatus 3. Apparatus 3 includes datawrite and read-measurement circuitry 4 for writing data to the PCM cells and for making cell measurements allowing determination of cell state and hence read back of stored data.

Circuitry 4 can address individual PCM cells for write and read purposes by applying appropriate voltage signals to an array of word and bit lines in memory ensemble 2.

This process is performed in generally known manner except as detailed hereinafter. A read/write controller 5 controls operation of apparatus 3. In general, the functionality of controller 5 can be implemented in hardware or software or a combination thereof, though use of hardwired logic circuits is generally preferred for reasons of operating speed. Suitable implementations will be apparent to those skilled in the art from the description herein. As indicated by block 6 in FIG. 6, user data input to device 1 is typically subjected to some form of write-processing, such as coding for error-correction purposes, before being supplied as write data to read/write apparatus 3. Similarly, read back data output by apparatus 3 is generally processed by a read-processing module 7, e.g. performing codeword detection and error correction operations, to recover the original input user data. Such processing by modules 6 and 7 is independent of the cell-state measurement system to be described and need not be discussed further here.

Each of the multilevel cells in memory 2 can be set to one of s resistance levels, where s>2, corresponding to different amorphous/crystalline states of the cell. To write data to memory cells, circuitry 4 applies programming pulses (via cell bit-lines or word-lines depending on whether voltage-mode or current-mode programming is used) of appropriate amplitude to set cells to states representative of the write data. Subsequent reading of a memory cell involves determining the state of the cell, i.e. detecting which of the possible levels that cell is set to. In a read operation of memory device 1, circuitry 4 performs cell measurements from which cell-states can be determined and the stored data recovered.

Figure 7:
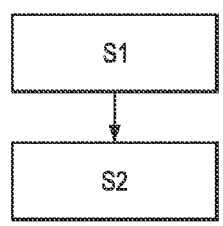
FIG. 7 shows an embodiment of a sequence of method steps for producing a memory device for thermoelectric heat confinement.

FIG. 7 shows an embodiment of a sequence of method steps for producing a memory device 100 for thermoelectric heat confinement, as shown in FIG. 1, for example. The method of FIG. 7 has the following steps S1 and S2.

In step S1, a plurality of PCM cells is provided, each having a first electrode, a second electrode and a phase-change material.

In step S2, the first electrode and the phase-change material are arranged such that a surface normal of an interface, in particular, a dominating interface for a current flow between the first electrode and the phase-change material points on one side to the phase-change material of the PCM cell and on an opposite side to a phase-change material of a neighboring PCM cell.

The effects and advantages of the present cell design for thermal electric heat confinement can be evident by FIGS. 8-18.

Figure 8:
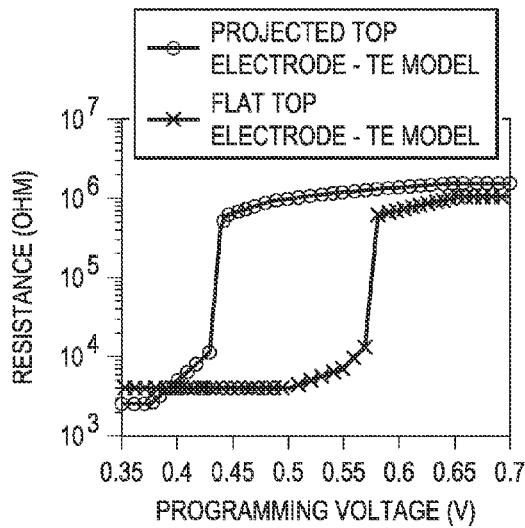
FIG. 8 shows V-R programming curves for a cell with a projected top electrode and a cell with a flat top electrode.
Figure 9:
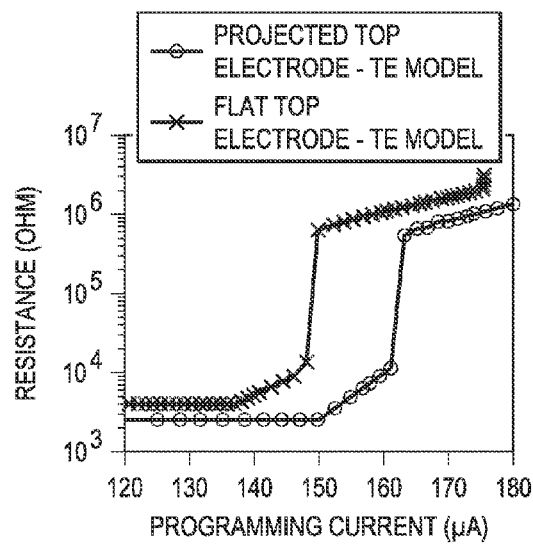
FIG. 9 shows I-R programming curves for a cell with a projected top electrode and a cell with a flat top electrode.
Figure 10:
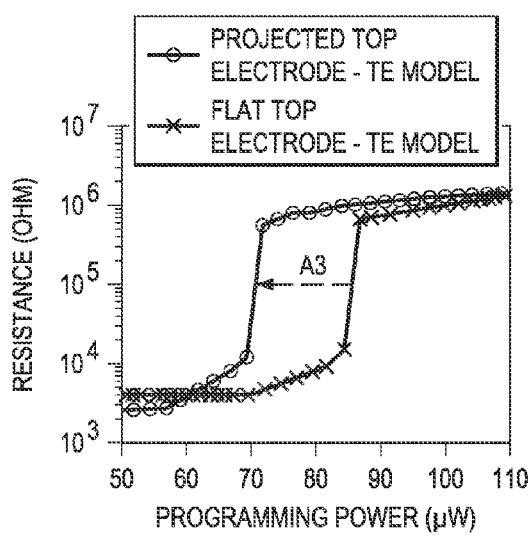
FIG. 10 shows P-R programming curves for a cell with a projected top electrode and a cell with a flat top electrode.

In this regard, FIGS. 8-10 show programming curves for a cell with a projected top electrode (PTE) compared to a cell with a flat top electrode (FTE). In detail, FIG. 8 shows the programming voltage V, FIG. 9 the programming current I and FIG. 10 the programming power P over the resistance R. FIGS. 8 to 10 illustrate that in the PTE cell, lateral heat confinement due to the thermoelectric effect (TE model) at the top electrode and the phase-change interface helps in improving the efficiency of the cell. Further, the SET resistance of the PTE cell is lower than that of the FTE cell. The reason is that the volume of phase-change material that needs to be amorphized is smaller in case of the PTE cell. As indicated by arrow A3 in FIG. 10, there is a reduction of about 16.7% in programming power for the PTE cell compared to the FTE cell.

Figures 11, 12, 13:
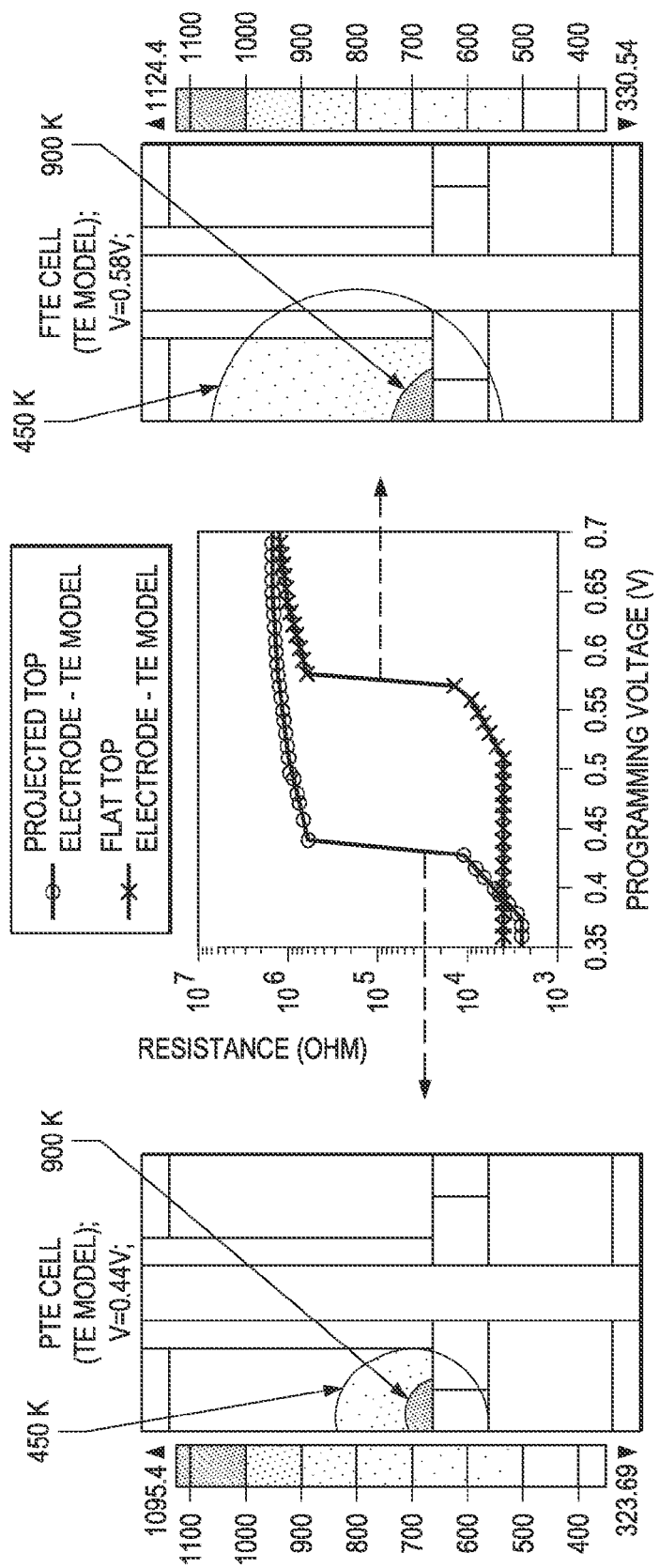
FIG. 11 shows a temperature map illustrating a hotspot location in a cell with a projected top electrode.
FIG. 12 shows V-R programming curves for a cell with a projected top electrode and a cell with a flat top electrode.
FIG. 13 shows a temperature map illustrating a hotspot location in a cell with a flat top electrode.

Furthermore, FIGS. 11 and 13 show temperature maps for a hotspot location for the PTE cell and the FTE cell, respectively, for programming voltages that just achieve plugging of the heater electrode (resulting in the first sharp increase in read out resistance). To give a reference, FIG. 12 shows the programming voltages for the PTE cell and the FTE cell (see FIG. 8). Comparing FIGS. 11 and 13, it is apparent that the hotspot of 900 K is smaller in the PTE cell than in the FTE cell. Also, the hotspot area of 450 K is smaller in the PTE cell of FIG. 11 compared to the FTE cell of FIG. 13.

Figure 14:
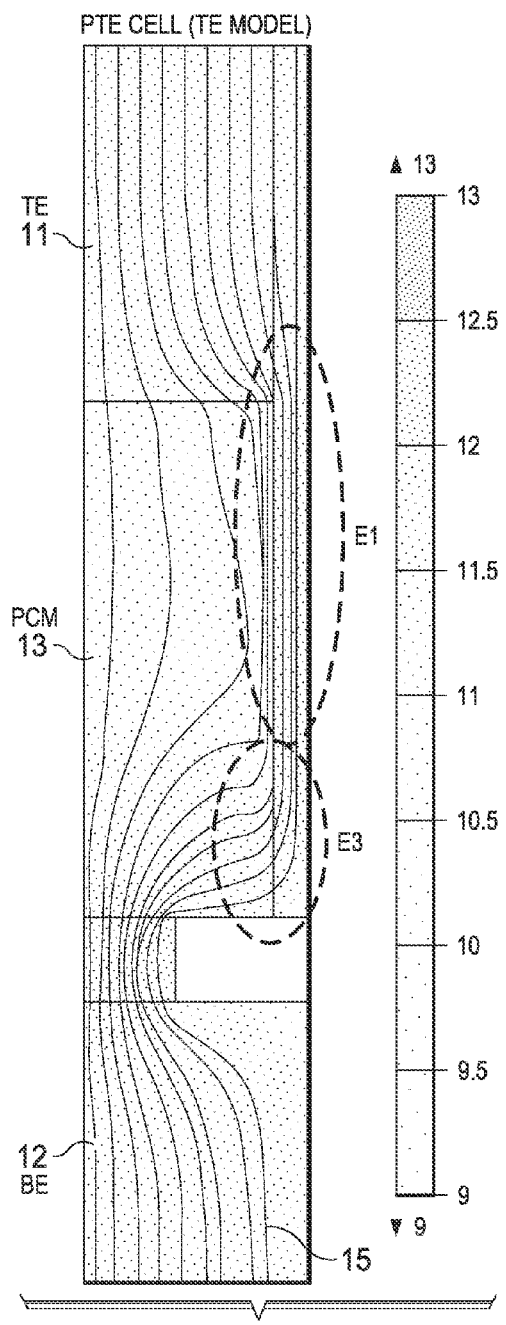
FIG. 14 shows a schematic diagram illustrating the current flow and the current density in a cell with a projected top electrode.
Figure 15:
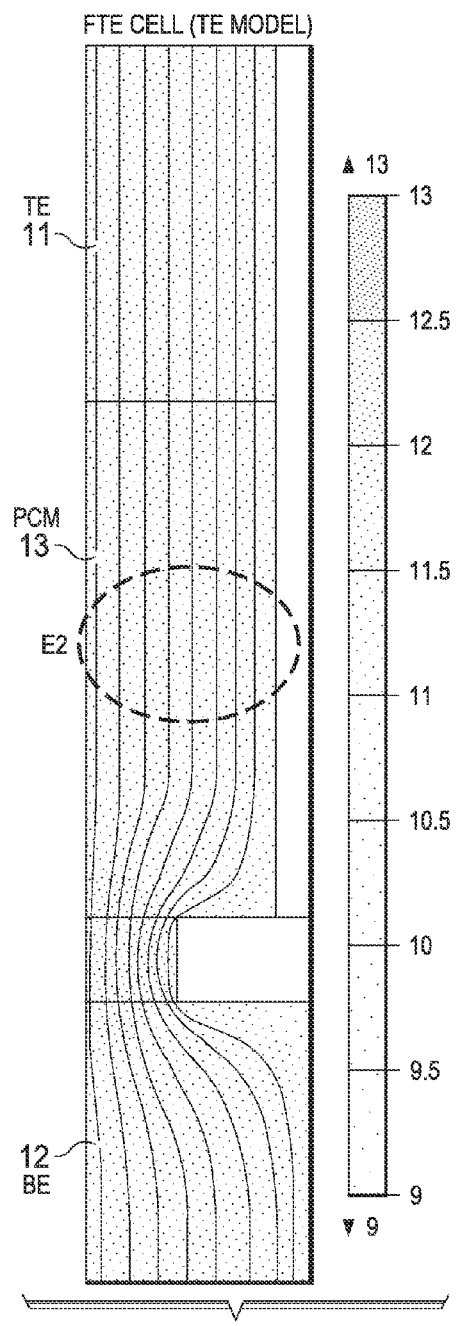
FIG. 15 shows a schematic diagram illustrating the current flow and the current density in a cell with a projected flat electrode.

FIGS. 14 and 15 show the current density and the direction of current flow in the PTE cell and the FTE cell, respectively. In FIG. 14, ellipse E1 shows a higher current density in the projected top electrode of the first electrode 11. In contrast, ellipse E2 in FIG. 15 shows a uniform current density inside the phase-change material 13 of the FTE cell. Further, ellipse E3 in FIG. 14 shows the lateral direction of the current flow at the interface 15 between the projected top electrode 11 and the phase-change material 13 of the PTE cell.

Figure 16:
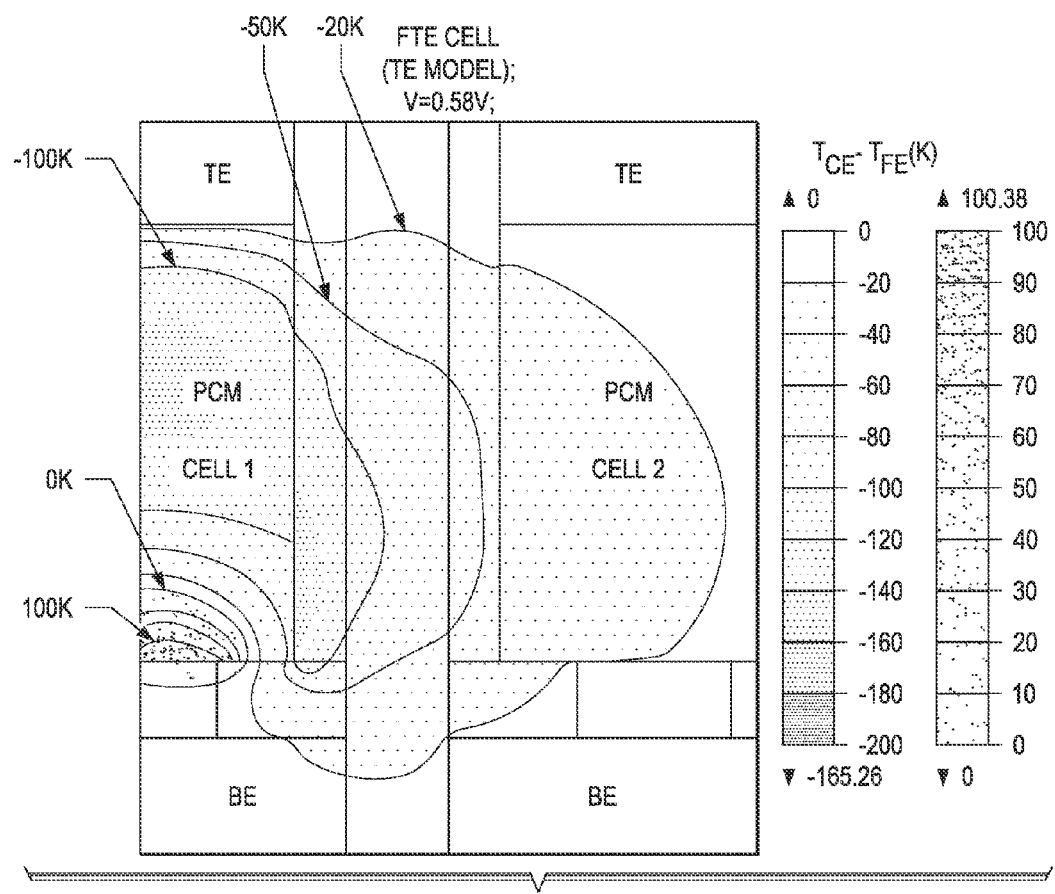
FIG. 16 shows a temperature difference map for two neighboring PCM cells.

FIG. 16 shows a temperature difference map for two neighboring PCM cells, PCM cell 1 and PCM cell 2. The temperature difference map of FIG. 16 clearly shows the additional heating and cooling provided by the projected top electrode. For a full RESET scenario, the projected top electrode clearly has greater thermal confinement compared to an FTE cell, for example. Thus, the thermal disturb of the present cell design is much smaller compared to a conventional FTE cell design.

Figure 17:
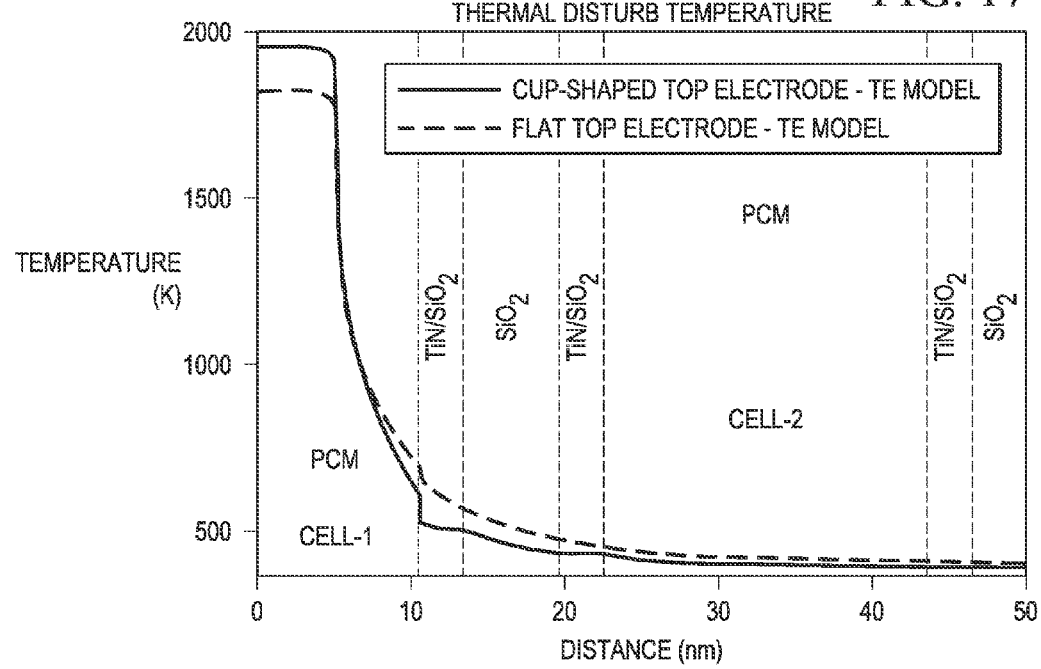
FIG. 17 shows a diagram illustrating a thermal disturb temperature from a PCM cell to a neighboring PCM cell.
Figure 18:
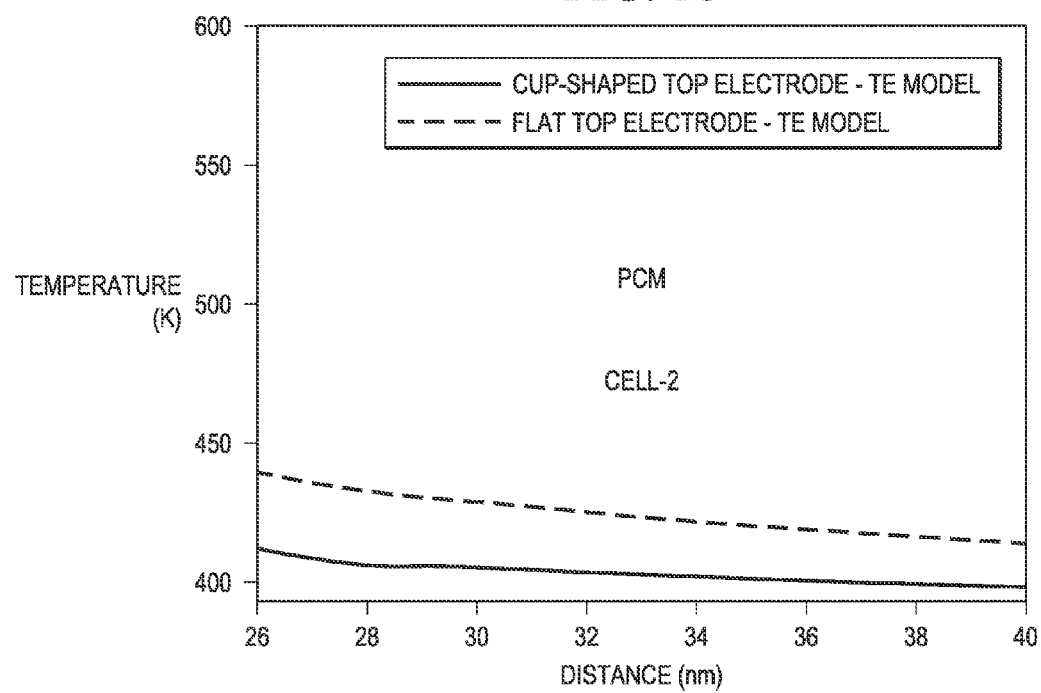
FIG. 18 shows a diagram illustrating a temperature gradient in the neighboring PCM cell of FIG. 17.

Moreover, FIG. 17 shows a diagram illustrating the thermal disturb temperature from a first cell, e.g. PCM cell 1, to a second cell, e.g. PCM cell 2. In detail, FIG. 17 shows two temperature curves in dependence on distance. A first curve with a dashed line shows the temperature curve for a flat top electrode in the TE model, wherein a second curve with a full line shows a cup-shaped top electrode in the TE model. Further, FIG. 18 illustrates details for the temperature gradient in the PCM cell 2, also with a full line for the cup-shaped top electrode and a dashed line for the flat top electrode.

With respect to FIG. 17, because of the thermal confinement in the cup-shaped top electrode and the Peltier cooling at the top electrode interface, the surrounding temperature is reduced greatly. For conventional cell dimensions, one can clearly see around 8% to 10% reduction in the disturb temperature. Also, the 2D thermal profile gives a clear picture of how this projected top electrode helps in reducing the surrounding temperature, while attaining higher temperatures at the hotspot.

The interface Peltier effect can assist the heating in the memory cell being programmed while cooling the surrounding. The interface for the current flow between the first electrode and the phase-change material points on the one side to the phase-change material of the PCM cell and on the opposite side to the phase-change material of at least one of neighboring PCM cells. The heating of the memory cell being programmed helps to improve the efficiency inside the memory cell being programmed, while the cooling of the surrounding helps to reduce the thermal disturbed temperature at surrounding memory cells.

In particular, because of the different Seebeck coefficients of the first electrode and the phase-change material, thermoelectric heating and cooling can take place within the PCM cell. Depending on the direction of the current density, cooling and heating with respect to Joule heating without thermoelectric effect can happen.

According to some implementations, the electrodes, in particular the first electrode, are designed such that the current density is directed suitably, the heating can occur within the written memory cell while cooling can occur at the neighboring cell(s). This reduces the thermal disturb, while at the same time increasing programming efficiency.

According to an embodiment, the interface for the current flow between the first electrode and the phase-change material can be also called dominating interface, because the main amount of the current between the first electrode and the phase-change material that causes the interface Peltier effect flows over that interface.

The PCM cell can be understood as a non-linear resistive device. In particular, the PCM cells form a memory array. In an embodiment, the dominating interface is configured for heating the PCM cell being programmed while cooling the neighboring PCM cell.

In a further embodiment, the first electrode has a cup shape. The first electrode can also have a pot shape or a pan shape. The cup-shaped electrode, the pan-shaped electrode or the pot-shaped electrode can be also called extended electrode. By using that extended electrode, an interface is generated where the current flows laterally inwards the interface resulting in heating on one side while cooling at the other side at the surrounding.

Further, a higher current density is provided in the side region of the extended electrode compared to the top region of the phase-change material. In case of a cup-shaped first electrode, the interface or dominating interface for the current flow between the first electrode and the phase-change material is at the connection of the side region of the cup-shaped electrode and the side region of the phase change material, particularly at the maximum distance to the top region of the phase-change material.

In particular, the interface or dominating interface is a lateral interface ensuring a lateral current flow between the first electrode and the phase-change material such that the phase-change material of the programmed cell is heated while the phase-change material of the neighboring PCM cells is cooled.

In a further embodiment, the first electrode and the phase-change material are arranged such that the surface normal of the dominating interface for a current flow between the first electrode and the phase-change material points on the one side to the phase-change material of the PCM cell and on the opposite side to the phase-change material of a plurality of the neighboring PCM cells.

In a further embodiment, the first electrode is a top electrode and the second electrode is a bottom electrode, wherein the phase-change material is arranged between the first electrode and the second electrode.

In a further embodiment, the first electrode is a cup-shaped electrode having a top region and a side region, wherein the top region of the cup-shaped electrode interfaces a top region of the phase-change material and the side region of the cup-shaped electrode interfaces a side region of the phase-change material.

In a further embodiment, the top electrode is a cup-shaped top electrode having a top region and a side region, wherein the top region of the cup-shaped electrode interfaces a top region of the phase-change material and the side region of the cup-shaped electrode interfaces a side region of the phase-change material.

In a further embodiment, each of the plurality of PCM cells has a geometry fulfilling the following condition: $\rho pcm \cdot A_{EL} > \rho el \cdot A_{PCM}$. $A_{EL}$ designates a cross-section of the side region of the cup-shaped top electrode for a vertical current flow through the side region. $A_{PCM}$ designates a cross-section of the phase-change material for vertical current flow between the cup-shaped top electrode and the phase-change material. $\rho pcm$ designates an electrical resistivity of the phase-change material and
$\rho el$ designates an electrical resistivity of the cup-shaped top electrode.

In a further embodiment, each of the plurality of PCM cells has a geometry in which the following quotient is maximized: $\rho pcm \cdot A_{EL} / \rho el \cdot A_{PCM}$. By maximizing the above-mentioned quotient, it is ensured that the essential amount of the current flows over the side region of the cup-shaped top electrode to the phase-change material, but not over its top region to the phase change material.

In a further embodiment, each of the plurality of PCM cells has a geometry fulfilling the following condition: $H \cdot A_{INT} > L \cdot A_{PCM}$, where $A_{INT}$ designates a cross-section of an interface for a lateral current flow between the side region of the cup-shaped top electrode and the phase-change material. $A_{PCM}$ designates a cross-section of the phase-change material for vertical current flow between the cup-shaped top electrode and the phase-change material. H designates a height of the phase-change material and L designates a minimum distance between the cup-shaped top electrode and the bottom electrode.

In a further embodiment, each of the plurality of PCM cells has a geometry in which the following quotient is maximized: $H \cdot A_{INT}/L \cdot A_{PCM}$. By maximizing the above-mentioned quotients, it is ensured that the essential amount of the current flows over the side region of the cup-shaped top electrode to the phase-change material, but not over its top region to the phase change material.

In a further embodiment, the first electrode includes a sidewall-electrode connected to a word line and the second electrode includes a heater electrode connected to a bit line.

Thus, the design of the present embodiment is a sidewall-electrode cell design. In particular, the heater electrode or the sidewall-electrode is penetrated into the phase-change material (PCM layer) to generate a lateral current flow through the interface.

In a further embodiment, the memory device includes a first interface for a current flow between the sidewall-electrode and the phase-change material, and a second interface for a current flow between the heater electrode and the phase change material. One of the first and second interfaces is a lateral interface and the other one of the first and second interfaces is a vertical interface.

In a further embodiment, the first interface is the lateral interface and the second interface is the vertical interface.

In a further embodiment, the first interface is the vertical interface and the second interface is the lateral interface.

In a further embodiment, the material parameters of each of the plurality of PCM cells are chosen such that a Seebeck coefficient of the phase change material is maximized.

In a further embodiment, the material parameters of each of the plurality of PCM cells are chosen such that a temperature-dependence of the Seebeck coefficient of the phase-change material is maximized.

In a further embodiment, the material parameters of each of the plurality of PCM cells are chosen such that the difference between the Seebeck coefficient of the phase-change material and a Seebeck coefficient of the first electrode is maximized.

The memory system includes a memory device of above mentioned in the embodiment thereof including a plurality of PCM cells each having a plurality of programmable levels, and a read/write apparatus for reading and writing data in the PCM cells.

While the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiments disclosed, but that the present invention will include all embodiments falling within the scope of the appended claims.

What is claimed is:

1. A memory device for thermoelectric heat confinement, the memory device having a plurality of phase-change memory cells, wherein each of the phase-change memory cells comprises:
    a first electrode;
    a second electrode; and
    a phase-change material, wherein the first electrode and the phase-change material are arranged such that a surface normal of an interface for a current flow between the first electrode and the phase-change material points on one side to the phase-change material of the phase-change memory cell and on an opposite side to a phase-change material of a neighboring phase-change memory cell, wherein the first electrode is a cup-shaped electrode having a too region and a side region, wherein the top region of the cup-shaped electrode interfaces a top region of the phase-change material and the side region of the cup-shaped electrode interfaces a side region of the phase-change material, and wherein each of the plurality of phase-change memory cells has a geometry fulfilling the following condition, $\rho pcm \cdot A_{EL} > \rho el \cdot A_{PCM}$;
    where $A_{EL}$ designates a cross-section of the side region of the cup-shaped top electrode for a vertical current flow through the side region;
    where $A_{PCM}$ designates a cross-section of the phase-change material for vertical current flow between the cup-shaped top electrode and the phase-change material;
    where $\rho pcm$ designates an electrical resistivity of the phase-change material; and
    where $\rho el$ designates an electrical resistivity of the cup-shaped top electrode.

2. The memory device according to claim 1, wherein the interface is configured for heating the phase-change memory cell being programmed while cooling the neighboring phase-change memory cell.

3. The memory device according to claim 1, wherein the first electrode and the phase-change material are arranged such that the surface normal of the interface for a current flow between the first electrode and the phase-change material points on the one-side to the phase-change material of the phase-change memory cell and on the opposite side to the phase-change material of a plurality of neighboring phase-change memory cells.

4. The memory device according to claim 1, wherein the first electrode is a top electrode and the second electrode is a bottom electrode, wherein the phase-change material is arranged between the first electrode and the second electrode.

5. The memory device according to claim 1, wherein each of the plurality of phase-change memory cells has a geometry fulfilling the following condition: $H \cdot A_{INT} > L \cdot A_{PCM}$;
    where $A_{INT}$ designates a cross-section of an interface for a lateral current flow between the side region of the cup-shaped top electrode and the phase-change material;
    where $A_{PCM}$ designates a cross-section of the phase-change material for vertical current flow between the cup-shaped top electrode and the phase-change material;
    where H designates a height of the phase-change material; and
    where L designates a minimum distance between the cup-shaped top electrode and the bottom electrode.

6. The memory device according to claim 1, wherein the first electrode includes a sidewall-electrode connected to a word line and the second electrode includes a heater electrode connected to a bit line.

7. The memory device according to claim 6, further comprising:
    a first interface for a current flow between the sidewall-electrode and the phase-change material;
    a second interface for a current flow between the heater electrode and the phase change material; and
    wherein one of the first and second interfaces is a lateral interface and the other one of the first and second interfaces is a vertical interface.

8. The memory device according to claim 7, wherein the first interface is the lateral interface and the second interface is the vertical interface.

9. The memory device according to claim 7, wherein the first interface is the vertical interface and the second interface is the lateral interface.

10. The memory device according to claim 8, wherein the first interface is the vertical interface and the second interface is the lateral interface.

11. The memory according to claim 1, wherein the material parameters of each of the plurality of phase-change memory cells are chosen such that a Seebeck coefficient of the phase-change material is maximized.

12. The memory device according to claim 11, wherein the temperature-dependence of the Seebeck coefficient of the phase-change material is maximized and/or that the difference between the Seebeck coefficient of the phase-change material and a Seebeck coefficient of the first electrode is maximized.

13. The memory device according to claim 1, further comprising:
a read/write apparatus for reading and writing data in the phase-change memory cells.

14. The memory device according to claim 12, further comprising:
a read/write apparatus for reading and writing data in the phase-change memory cells.

15. A method for producing a memory device for thermoelectric heat confinement, the memory device including a plurality of phase-change memory cells, each having a first electrode, a second electrode and a phase-change material, the method comprising:
arranging the first electrode and the phase-change material such that a surface normal of an interface for a current flow between the first electrode and the phase-change material points on one side to the phase-change material of the phase-change memory cell and on an opposite side to a phase-change material of a neighboring phase-change memory cell, wherein the first electrode is a cup-shaped electrode having a top region and a side region, wherein the top region of the cup-shaped electrode interfaces a to region of the phase-change material and the side region of the cup-shaped electrode interfaces a side region of the phase-change material, and wherein each of the plurality of phase-change memory cells has a geometry fulfilling the following condition, $\rho_{pcm} \cdot A_{EL} > \rho_{el} \cdot A_{PCM}$;
where $A_{EL}$ designates a cross-section of the side region of the cup-shaped top electrode for a vertical current flow through the side region;
where $A_{PCM}$ designates a cross-section of the phase-change material for vertical current flow between the cup-shaped top electrode and the phase-change material;
where $\rho_{pcm}$ designates an electrical resistivity of the phase-change material; and
where $\rho_{el}$ designates an electrical resistivity of the cup-shaped top electrode.

16. The method according to claim 15, wherein the interface is configured for heating the phase-change memory cell being programmed while cooling the neighboring phase-change memory cell.

17. The method according to claim 15, wherein the first electrode and the phase-change material are arranged such that the surface normal of the interface for a current flow between the first electrode and the phase-change material points on the one-side to the phase-change material of the phase-change memory cell and on the opposite side to the phase-change material of a plurality of neighboring phase-change memory cells.

18. The method according to claim 15, wherein the first electrode is a top electrode and the second electrode is a bottom electrode, wherein the phase-change material is arranged between the first electrode and the second electrode.

19. The method according to claim 15, wherein each of the plurality of phase-change memory cells has a geometry fulfilling the following condition: $H \cdot A_{INT} > L \cdot A_{PCM}$;
where $A_{INT}$ designates a cross-section of an interface for a lateral current flow between the side region of the cup-shaped top electrode and the phase-change material;
where $A_{PCM}$ designates a cross-section of the phase-change material for vertical current flow between the cup-shaped top electrode and the phase-change material;
where H designates a height of the phase-change material; and
where L designates a minimum distance between the cup-shaped top electrode and the bottom electrode.

20. The method according to claim 15, wherein the first electrode includes a sidewall-electrode connected to a word line and the second electrode includes a heater electrode connected to a bit line.

* * * * *